(12) United States Patent
Shirai

(10) Patent No.: US 8,169,508 B2
(45) Date of Patent: May 1, 2012

(54) IMAGE INPUT APPARATUS FOR FORMING A COMPOSITE IMAGE BASED ON A PHOTOELECTRIC CONVERSION SIGNAL AND A SATURATION SIGNAL

(75) Inventor: Kunihiro Shirai, Ohta-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 829 days.

(21) Appl. No.: 11/477,565

(22) Filed: Jun. 30, 2006

(65) Prior Publication Data

US 2007/0003849 A1 Jan. 4, 2007

(30) Foreign Application Priority Data

Jun. 30, 2005 (JP) ................................. 2005-192584

(51) Int. Cl.
*H04N 5/217* (2006.01)
(52) U.S. Cl. ........ 348/241; 348/314; 348/315; 348/243; 348/222.1; 348/299
(58) Field of Classification Search .................. 348/399, 348/314–315, 241, 243, 222.1, 299
See application file for complete search history.

(56) References Cited

U.S. PATENT DOCUMENTS

| | | | | |
|---|---|---|---|---|
| 5,293,239 | A * | 3/1994 | Takahashi et al. | 348/241 |
| 5,297,043 | A * | 3/1994 | Tuy et al. | 702/27 |
| 6,307,195 | B1 * | 10/2001 | Guidash | 250/208.1 |
| 7,349,015 | B2 | 3/2008 | Harada et al. | |
| 7,349,126 | B2 * | 3/2008 | McDermott | 358/3.15 |
| 2004/0239781 | A1 * | 12/2004 | Harada et al. | 348/241 |
| 2004/0239791 | A1 | 12/2004 | Mabuchi | |
| 2005/0110895 | A1 * | 5/2005 | Masuyama | 348/362 |
| 2005/0269604 | A1 * | 12/2005 | Koizumi et al. | 257/291 |
| 2006/0044437 | A1 * | 3/2006 | Shah | 348/308 |
| 2008/0224146 | A1 * | 9/2008 | Ichikawa | 257/72 |
| 2008/0266434 | A1 * | 10/2008 | Sugawa et al. | 348/308 |
| 2008/0278612 | A1 * | 11/2008 | Egawa | 348/302 |
| 2010/0201850 | A1 * | 8/2010 | Lin | 348/242 |

FOREIGN PATENT DOCUMENTS

| | | |
|---|---|---|
| JP | 2001-186414 A | 7/2001 |
| JP | 2003-018471 A | 1/2003 |
| JP | 2005-051282 A | 2/2005 |

OTHER PUBLICATIONS

Keisuke Araki, "Paraxial Analysis for Off-Axial Optical Systems", Japanese Journal of Optics, vol. 29, No. 3, 2000.

* cited by examiner

*Primary Examiner* — Jason Chan
*Assistant Examiner* — Cynthia Calderon
(74) *Attorney, Agent, or Firm* — Canon USA, Inc. I.P. Division

(57) ABSTRACT

At least one exemplary embodiment is directed to an image input apparatus including a plurality of pixel sections, each including a light-sensitive element configured to generate electric charge by photoelectric conversion, a semiconductor region configured to receive a signal transferred from the light-sensitive element, and a transfer switch configured to transfer the signal from the light-sensitive element to the semiconductor region. An image is formed based on a composite signal obtained by combining a saturation signal representing photoelectric charge overflowing from the light-sensitive element and flowing into the semiconductor region and a photoelectric conversion signal stored in the light-sensitive element. Formation of the image is controlled based on a corrected composite signal obtained by correcting a component corresponding to a noise component. The noise component includes a noise component generated in the semiconductor region during a charge accumulation period during which the light-sensitive element performs the photoelectric conversion.

16 Claims, 9 Drawing Sheets

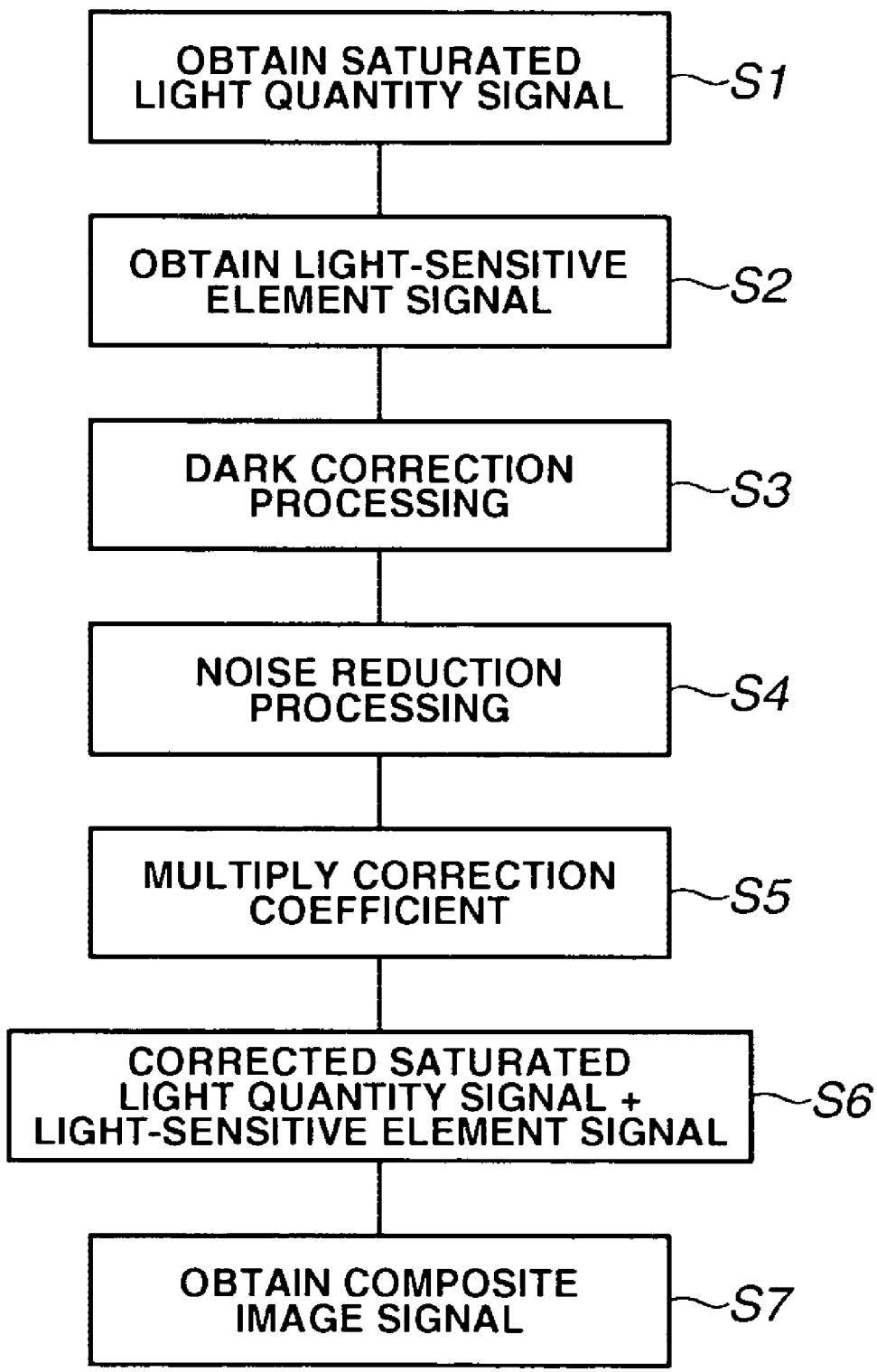

IMAGE INPUT APPARATUS FOR FORMING A COMPOSITE IMAGE BASED ON A PHOTOELECTRIC CONVERSION SIGNAL AND A SATURATION SIGNAL

BACKGROUND OF THE INVENTION

1. Field of the Invention

The present invention relates to an image input apparatus configured to form a composite image based on a photoelectric conversion signal and a saturation signal. Furthermore, the present invention relates to a control method for the image input apparatus.

2. Description of the Related Art

Digital cameras or other image input apparatuses use a solid-state image sensor, such as a CMOS (complementary metal-oxide semiconductor), having a narrow dynamic range compared to conventional silver-halide photography. To compensate for this drawback, Japanese Patent Application Laid-Open No. 2003-18471 discusses a method for enlarging the dynamic range based on photoelectric saturation charge flowing into a reading section of an imaging element obtainable when a light-sensitive element receives incident light exceeding its capacity.

According to a conventional method for enlarging the dynamic range, a saturated light quantity signal representing photoelectric charge flowing into the reading section and a light-sensitive element signal stored in the light-sensitive element, are independently read out and simply added to obtain an image having an enlarged dynamic range.

However, a reading section of an ordinary solid-state image sensor is not essentially configured to store the photoelectric charge overflowing from a light-sensitive element. If a signal obtained from the reading section is combined with a light-sensitive element signal without any correction, the resultant composite image will contain a significant amount of noise component and its gradation will be unnatural.

SUMMARY OF THE INVENTION

At least one exemplary embodiment is directed to an image input apparatus configured to form a composite image based on a photoelectric conversion signal and a saturation signal. For example at least one exemplary embodiment is directed to an image input apparatus and a control method thereof which can reduce noises and obtain a composite image having an excellent gradation and a wide dynamic range.

At least one exemplary embodiment is directed to an image input apparatus including: a plurality of pixel sections, each including a light-sensitive element configured to generate electric charge by photoelectric conversion, a semiconductor region configured to receive a signal transferred from the light-sensitive element, and a transfer switch configured to transfer the signal from the light-sensitive element to the semiconductor region; an image processing section configured to form an image based on a composite signal obtained by combining a saturation signal representing photoelectric charge overflowing from the light-sensitive element and flowing into the semiconductor region and a photoelectric conversion signal stored in the light-sensitive element; and a control section configured to control formation of the image based on a corrected composite signal obtained by correcting a component corresponding to a noise component, where the noise component includes a noise component generated in the semiconductor region during a charge accumulation period during which the light-sensitive element performs the photoelectric conversion.

Furthermore, at least one exemplary embodiment is directed to an image input apparatus including: a plurality of pixel sections, each including a light-sensitive element configured to generate electric charge by photoelectric conversion, a semiconductor region configured to receive a signal transferred from the light-sensitive element, and a transfer switch configured to transfer the signal from the light-sensitive element to the semiconductor region; an image processing section configured to form an image based on a composite signal obtained by combining a saturation signal representing photoelectric charge overflowing from the light-sensitive element and flowing into the semiconductor region and a photoelectric conversion signal stored in the light-sensitive element; and a control section configured to control formation of the image based on a composite signal corrected according to an imaging condition.

Furthermore, at least one exemplary embodiment is directed to an image input apparatus including: a plurality of pixel sections, each including a light-sensitive element configured to generate electric charge by photoelectric conversion, a semiconductor region configured to receive a signal transferred from the light-sensitive element, and a transfer switch configured to transfer the signal from the light-sensitive element to the semiconductor region; an image processing section configured to form an image based on a composite signal obtained by combining a saturation signal representing photoelectric charge overflowing from the light-sensitive element and flowing into the semiconductor region and a photoelectric conversion signal stored in the light-sensitive element; and a control section configured to control correction of the saturation signal so as to reduce a difference between an increase rate of the level of the photoelectric conversion signal relative to the lightness of a photographed object and an increase rate of the level of the saturation signal relative to the lightness of the photographed object.

Furthermore, at least one exemplary embodiment is directed to a control method for an image input apparatus including a plurality of pixel sections, each including a light-sensitive element configured to generate electric charge by photoelectric conversion, a semiconductor region configured to receive a signal transferred from the light-sensitive element, and a transfer switch configured to transfer the signal from the light-sensitive element to the semiconductor region, including the steps of: forming an image based on a composite signal obtained by combining a saturation signal representing photoelectric charge overflowing from the light-sensitive element and flowing into the semiconductor region and a photoelectric conversion signal stored in the light-sensitive element; and controlling formation of the image based on a corrected composite signal obtained by correcting a component corresponding to a noise component, where the noise component includes a noise component generated in the semiconductor region during a charge accumulation period during which the light-sensitive element performs the photoelectric conversion.

Furthermore, at least one exemplary embodiment is directed to a control method for an image input apparatus including a plurality of pixel sections, each including a light-sensitive element configured to generate electric charge by photoelectric conversion, a semiconductor region configured to receive a signal transferred from the light-sensitive element, and a transfer switch configured to transfer the signal from the light-sensitive element to the semiconductor region, including the steps of: forming an image based on a composite signal obtained by combining a saturation signal representing photoelectric charge overflowing from the light-sensitive element and flowing into the semiconductor region and a photoelectric conversion signal stored in the light-sensitive element; and controlling formation of the image based on a composite signal corrected according to an imaging condition.

Furthermore, at least one exemplary embodiment is directed to a control method for an image input apparatus including a plurality of pixel sections, each including a light-sensitive element configured to generate electric charge by photoelectric conversion, a semiconductor region configured to receive a signal transferred from the light-sensitive element, and a transfer switch configured to transfer the signal from the light-sensitive element to the semiconductor region, including the steps of: forming an image based on a composite signal obtained by combining a saturation signal representing photoelectric charge overflowing from the light-sensitive element and flowing into the semiconductor region and a photoelectric conversion signal stored in the light-sensitive element; and controlling correction of the saturation signal so as to reduce a difference between an increase rate of the level of the photoelectric conversion signal relative to the lightness of a photographed object and an increase rate of the level of the saturation signal relative to the lightness of the photographed object.

Further features of the present invention will become apparent from the following detailed description of exemplary embodiments with reference to the attached drawings.

BRIEF DESCRIPTION OF THE DRAWINGS

The accompanying drawings are incorporated in and constitute a part of the specification.

FIG. 11 is a flowchart showing an image combining operation performed by a system control section that can obtain a composite image signal having a wide dynamic range.

DETAILED DESCRIPTION OF THE EMBODIMENTS

Figure 1:
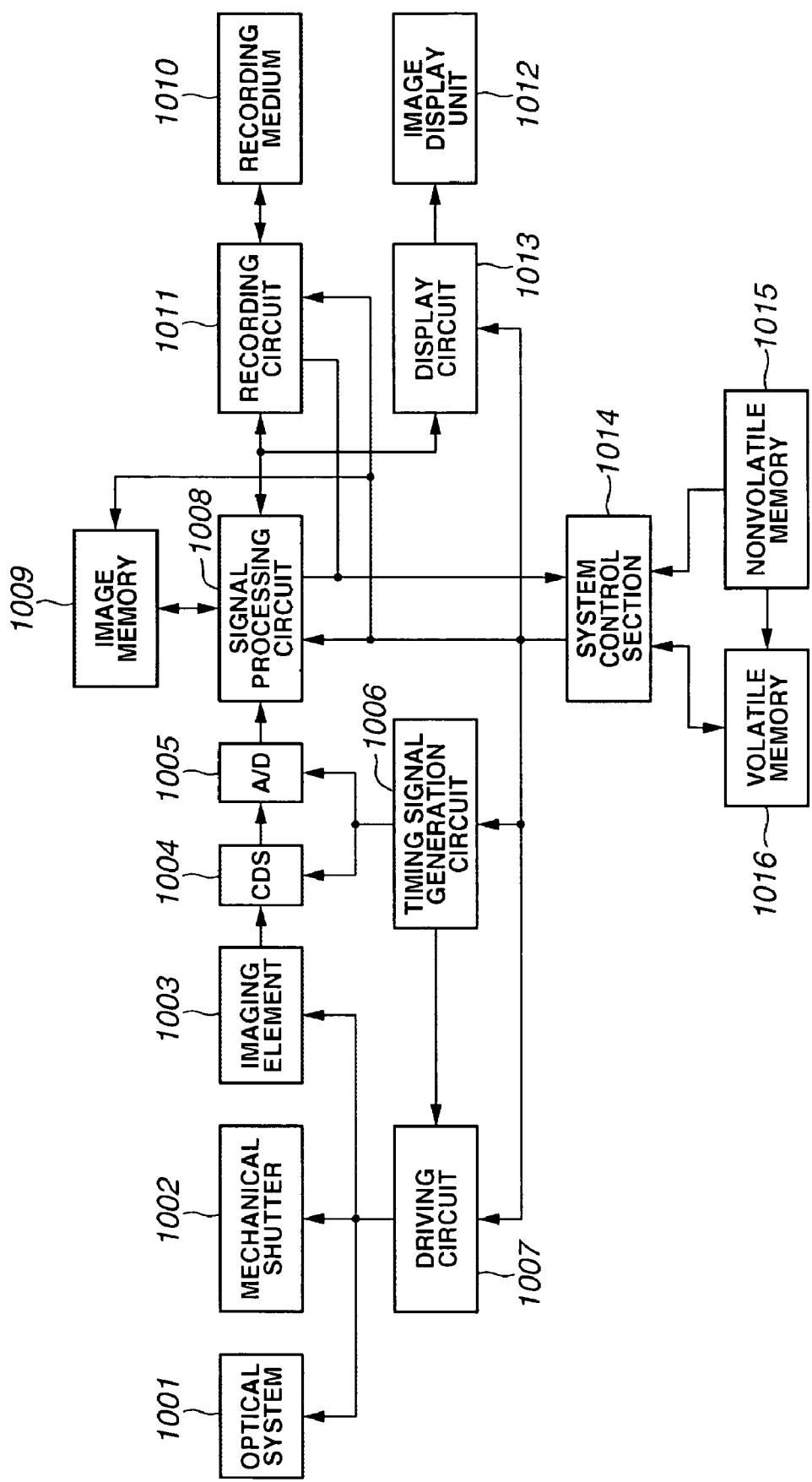
FIG. 1 is a block diagram illustrating an imaging apparatus according to a first exemplary embodiment.

The following description of exemplary embodiment(s) is/are merely illustrative in nature and is in no way intended to limit the invention, its application, or uses.

Processes, techniques, apparatuses, and materials as known by one of ordinary skill in the art may not be discussed in detail but are intended to be part of the enabling description where appropriate. For example, certain circuitry for signal processing, displaying, recording and others may not be discussed in detail. However these systems and the methods to fabricate these system as known by one of ordinary skill in the relevant art is intended to be part of the enabling disclosure herein where appropriate.

It is noted that throughout the specification, similar reference numerals and letters refer to similar items in the following figures, and thus once an item is described with reference to one figure, it may not be discussed for following figures. Note that herein when referring to correcting or corrections of an error (e.g., an aberration), a reduction of the error and/or a correction of the error is intended.

Exemplary embodiments will be described in detail below with reference to the drawings.

First Exemplary Embodiment

FIG. 1 is a block diagram illustrating an image input apparatus (i.e., an imaging apparatus) according to a first exemplary embodiment.

The image input apparatus includes an optical system 1001, a mechanical shutter 1002, an imaging element 1003, a CDS (correlated double sampling) circuit 1004, an A/D converter 1005, a timing signal generation circuit 1006, a driving circuit 1007, a signal processing circuit 1008, an image memory 1009, an image recording medium 1010, a recording circuit 1011, an image display unit 1012, a display circuit 1013, a system control section 1014, a nonvolatile memory (ROM) 1015, and a volatile memory (RAM) 1016.

The optical system 1001 includes a lens and a stop. The CDS circuit 1004 can process an entered analog signal. The A/D converter 1005 can convert the analog signal into a digital signal. The timing signal generation circuit 1006 can generate timing signals supplied to the imaging element 1003, the CDS circuit 1004, and the A/D converter 1005. The driving circuit 1007 can drive the optical system 1001, the mechanical shutter 1002, and the imaging element 1003. The signal processing circuit 1008 can perform signal processing required for photographed image data.

The image memory 1009 can store the image data processed by the signal processing circuit 1008. The image recording medium 1010 is detachably connected to the image input apparatus. The recording circuit 1011 can control recording of the processed image data into the image recording medium 1010. The image display unit 1012 can display the processed image data. The display circuit 1013 can control the image display apparatus 1011 to display an image. The system control section 1014 can control an overall operation of the image input apparatus.

The nonvolatile memory 1015 can store software program (s) describing the control method of the system control section 1014, together with control data including parameters and tables used when the system control section 1014 executes the program(s), as well as correction data including addresses of defects on the image. The volatile memory 1016 can temporarily store program(s), control data and correction data when they are transferred from (i.e., read out of) the nonvolatile memory 1015, so that the system control section 1014 can control the image input apparatus based on the readout program(s) and data.

The image input apparatus, which can have the above-described arrangement, can perform a photographing operation with the mechanical shutter 1002.

Prior to an actual photographing operation, the system control section 1014 starts a preparatory operation including turning on a power source of the image input apparatus. In the preparatory operation, the system control section 1014 reads a program together with related control data and correction data from the nonvolatile memory 1015 and transfers the readout program and data to the volatile memory 1016. The software program(s) and data can be used when the system control section 1014 controls the image input apparatus.

If necessary, additional program(s) and data can be transferred from the nonvolatile memory 1015 to the volatile memory 1016. The system control section 1014 can directly read the data from the nonvolatile memory 1015.

First, the optical system 1001 drives the stop and the lens in response to a control signal supplied from the system control section 1014, to form an image of a photographed object having an appropriate lightness on the imaging element 1003. Next, the driving circuit 1007 drives the mechanical shutter 1002 in response to a control signal supplied from the system control section 1014. The mechanical shutter 1002 blocks light entering the imaging element 1003 according to the operation of the imaging element 1003, so as to obtain an exposure time. In this case, if the imaging element 1003 has an electronic shutter function, the mechanical shutter 1002 and the imaging element 1003 will be able to cooperatively obtain an exposure time.

The driving circuit 1007 drives the imaging element (i.e., light-sensitive element) 1003 in response to a drive pulse which is formed based on an operation pulse generated from the timing signal generation circuit 1006 that the system control section 1014 can control. The imaging element 1003 has a photoelectric conversion function for converting a photographed object image into an electrical signal and outputs an analog image signal.

The CDS circuit 1004 receives the analog image signal from the imaging element 1003, and removes clock synchronous noises therefrom in response to an operation pulse generated from the timing signal generation circuit 1006 that the system control section 1014 controls. The A/D converter 1005 converts the noise-reduced analog image signal into a digital image signal. Next, under the control of the system control section 1014, the signal processing circuit 1008 applies various processing to the digital image signal, such as image processing including color conversion, white balance, gamma correction, as well as resolution conversion processing and image compression processing.

The image memory 1009 can temporarily store digital image signals being processed by the signal processing circuit 1008, and also store image data (i.e., digital image signals) resulting from the signal processing performed by the signal processing circuit 1008.

The image data produced from the signal processing circuit 1008 or the image data stored in the image memory 1009 can be supplied to the recording circuit 1011. The recording circuit 1011 can convert the input image data into data format suitable for the image recording medium 1010 (e.g., file system data which can have a hierarchical structure) to record the image data on the image recording medium 1010.

Furthermore, the image data having been subjected to the resolution conversion processing by the signal processing circuit 1008 can be supplied to the display circuit 1013. The display circuit 1013 can convert the input image data into a signal suitable for the image display unit 1012 (e.g., an analog signal of NTSC format) to display an image on the image display unit 1012.

If desirable, the signal processing circuit 1008 can directly output the digital image signal, as image data, to the image memory 1009 or to the recording circuit 1011, without performing the above-described signal processing when the control signal is supplied from the system control section 1014.

Furthermore, the system control section 1014 can request the signal processing circuit 1008 to transmit the digital image signal resulting from the signal processing, together with the information relating to image data, such as information relating to spatial frequency of the image, average value of a designated region, data amount of compression image, or, derivative information extracted from such information. Furthermore, the system control section 1014 can request the recording circuit 1011 to transmit the information relating to the type and an available capacity of the image recording medium 1010 to the system control section 1014.

Figure 2:
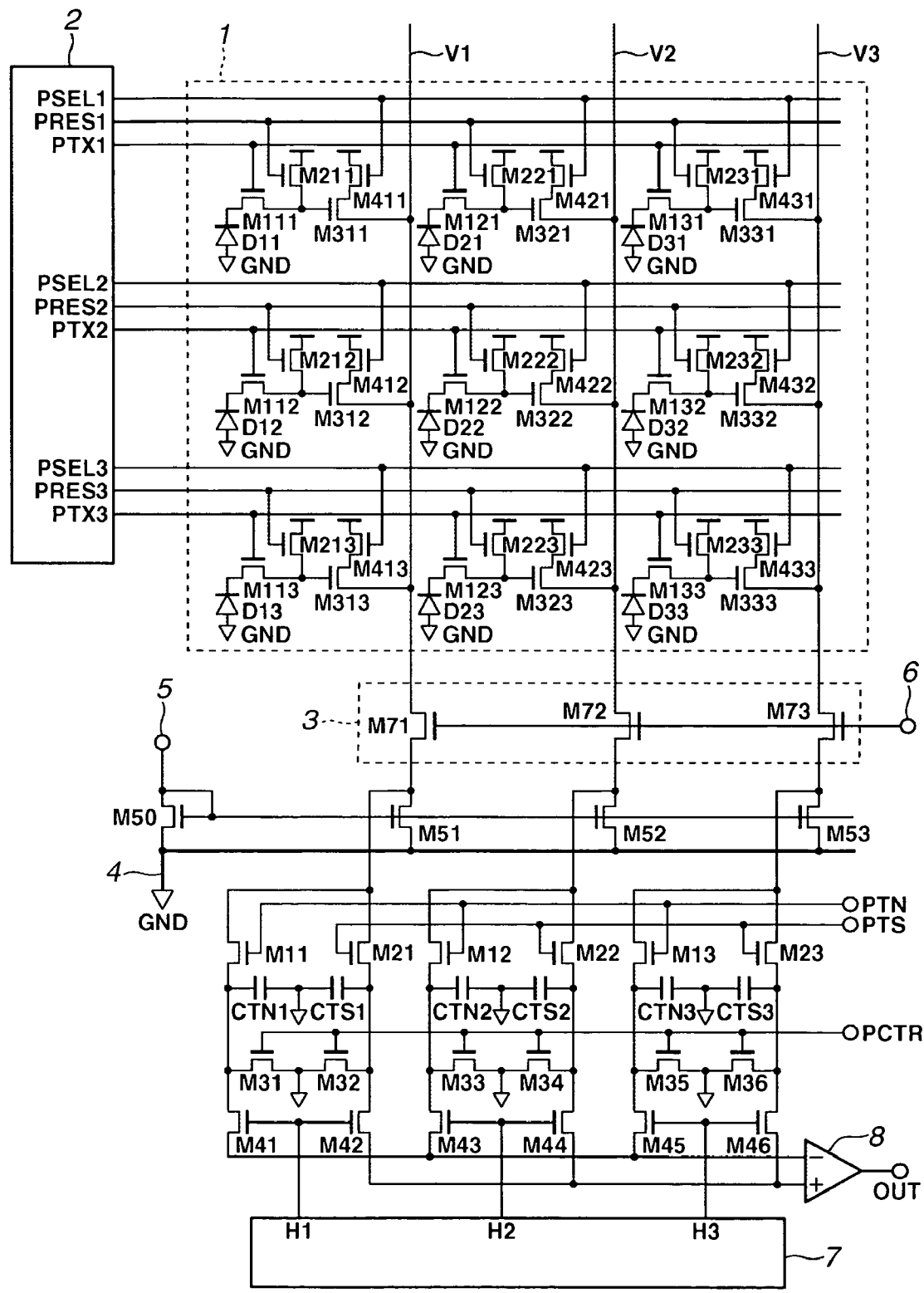
FIG. 2 is a circuit diagram illustrating an exemplary arrangement of a solid-state image sensor according to the first exemplary embodiment.

FIG. 2 is a circuit diagram illustrating an arrangement of a CMOS solid-state image sensor, as a practical example of the imaging element 1003 shown in FIG. 1. For example, the solid-state image sensor includes numerous circuit elements formed on a single semiconductor substrate, such as single crystal silicon, according to a manufacturing technique for the semiconductor integrated circuits.

For simplification, FIG. 2 shows a pixel array arranged in a matrix pattern including 3 rows and 3 columns. However, the pixel array is not limited to the arrangement and size shown in FIG. 2. An exemplary arrangement of the imaging element according to the present exemplary embodiment will be described with reference to FIG. 2.

Each of photodiodes D11 through D33 configured to generate a light signal charge is grounded at its anode. In the following description, a MOS (i.e., metal oxide semiconductor) field-effect transistor (FET) is simply referred to as a MOS. The photodiodes D11 through D33 have cathodes connected to source terminals of corresponding transfer MOSs M111 through M133, respectively. Each transfer MOS can transfer the photoelectric charge stored in the associated photodiode.

The transfer MOS 111 has a gate terminal connected to a first row selection line (vertical scanning line) PTX1, which extends in the horizontal direction. The transfer MOSs M121 and M131 of other pixel cells, disposed in the same row as the transfer MOS 111, have gate terminals commonly connected to the first row selection line PTX1.

Furthermore, the transfer MOSs M111 through M133 have drain terminals connected to gate terminals of corresponding amplification MOSs M311 through M333, respectively. The amplification MOSs M311 through M333 have gate terminals connected to source terminals of corresponding reset MOSs M211 through M233, respectively. Each of the reset MOSs M211 through M233 has a reset function for resetting the corresponding amplification MOS. The reset MOSs M211 through M233 have drain terminals connected to a reset power source.

Furthermore, the amplification MOSs M311 through M333 have drain terminals connected to corresponding selection MOSs M411 through M433, respectively. Each of the selection MOSs M411 through M433 can supply a power source voltage.

The reset MOS M211 has a gate terminal connected to a second row selection line (vertical scanning line) PRES1, which extends in the horizontal direction. The reset MOSs M221 and M231 of other pixel cells, disposed in the same row as the reset MOS 211, have gate terminals commonly connected to the second row selection line PRES1.

The selection MOS M411 has a gate terminal connected to a third row selection line (vertical scanning line) PSEL1, which extends in the horizontal direction. The selection MOSs M421 and M431 of other pixel cells, disposed in the same row as the selection MOS M411, have gate terminals commonly connected to the third row selection line PSEL1.

The first through third row selection lines are connected to a vertical scanning circuit block 2, which supplies a signal voltage to each selection line at predetermined operation timing as described later.

The pixel cells disposed in the other rows shown in FIG. 2 have similar arrangement, and similar row selection lines are provided for the pixel cells. The vertical scanning circuit block 2 can supply signal voltages to respective row selection lines PTX2, PTX3, PRES2, PRES3, PSEL2, and PSEL3.

The amplification MOS M311 has a source terminal connected to a vertical signal line V1, which extends in the vertical direction. The amplification MOSs M312 and M313 of the other pixel cells, disposed in the same column as the amplification MOS M311, have source terminals commonly connected to the vertical signal line V1. The vertical signal line V1 is connected to a load MOS M51 (i.e., a load element) via a grounded-gate MOS M71. The grounded-gate MOS M71 constitutes part of a constant-voltage unit 3.

The grounded-gate MOS M71 has a gate terminal connected to a voltage input terminal 6, which can supply a gate voltage. As shown in FIG. 2, amplification MOSs, a grounded-gate MOS, and a load MOS are connected to each of the remaining vertical signal lines V2 and V3.

Furthermore, the load MOSs M51 through M53 have source terminals connected to a common GND (ground) line 4 and gate terminals connected to a gate terminal of an input MOS M50 and to a voltage input terminal 5.

The vertical signal line V1 is connected via a noise signal transfer switch M11 to a capacitor CTN1, which can temporarily store a noise signal, and is also connected via a light signal transfer switch M21 to a capacitor CTS1, which can temporarily store a light signal. The noise signal holding capacitor CTN1 and the light signal holding capacitor CTS1 are grounded at their opposite terminals.

A connecting point of the noise signal transfer switch M11 and the noise signal holding capacitor CTN1 is grounded via a holding capacity reset switch M31, and is also connected via a horizontal transfer switch M41 to one input terminal of a differential circuit block 8.

A connecting point of the light signal transfer switch M21 and the light signal holding capacitor CTS1 is grounded via a holding capacity reset switch M32, and is also connected via a horizontal transfer switch M42 to the other input terminal of the differential circuit block 8 that the horizontal transfer switch M41 is not connected to. The differential circuit block 8 can output a differential signal representing a difference between the light signal and the noise signal.

The horizontal transfer switches M41 and M42 have gate terminals commonly connected to a column selection line H1 of a horizontal scanning circuit block 7. As shown in FIG. 2, similar reading circuits are provided for the remaining vertical signal lines V2 and V3.

Furthermore, the noise signal transfer switches M11 through M13 of respective columns have gate terminals commonly connected to a terminal PTN. The light signal transfer switches M21 through M23 of respective columns have gate terminals commonly connected to terminal PTS. As described later, signal voltages are supplied to the terminals PTN and PTS at predetermined operation timing.

Figure 3:
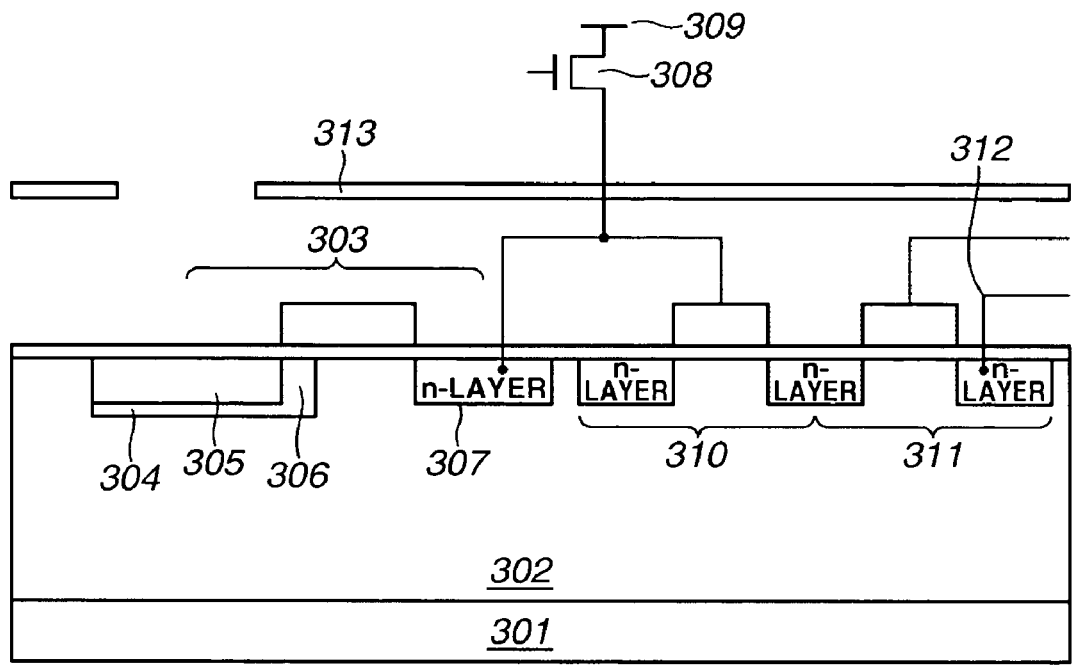
FIG. 3 is a cross-sectional view illustrating one pixel of the solid-state image sensor according to the first exemplary embodiment.

FIG. 3 shows an exemplary cross-sectional structure of one pixel of the imaging element 1003.

In FIG. 3, a photoelectric conversion element includes a p-type well 302 formed on an n-type substrate 301, an n-layer 304 of a photodiode formed on the p-type well 302, and a p-layer 305 of the photodiode formed on the n-layer 304.

The p-layer 305 has a higher density at its surface region. A gate region of a transfer MOS transistor 303 is formed via an insulating layer on a side surface of the photodiode. A bypass region 306, continuously extending from the n-layer 304 of the photodiode, is formed between the gate region of the transfer MOS transistor 303 and the side surface of the photodiode. Furthermore, a floating diffusion region (FD) 307 is formed beneath the side surface of the gate region of the transfer MOS transistor 303.

The floating diffusion region (FD) 307 is connected to the gate terminal of an amplification MOS transistor 310 of an output circuit. A reset MOS transistor 308, which resets the floating diffusion region (FD) 307, has a source terminal connected to the floating diffusion region (FD) 307 and a drain terminal connected to a reset power source 309.

The amplification MOS transistor 310 produces an amplified output signal which is removed via a pixel selection MOS transistor 311. An aluminum light-shielding plate 313 is provided above the element, so that no light can reach a region other than the photodiode region.

Figure 4:
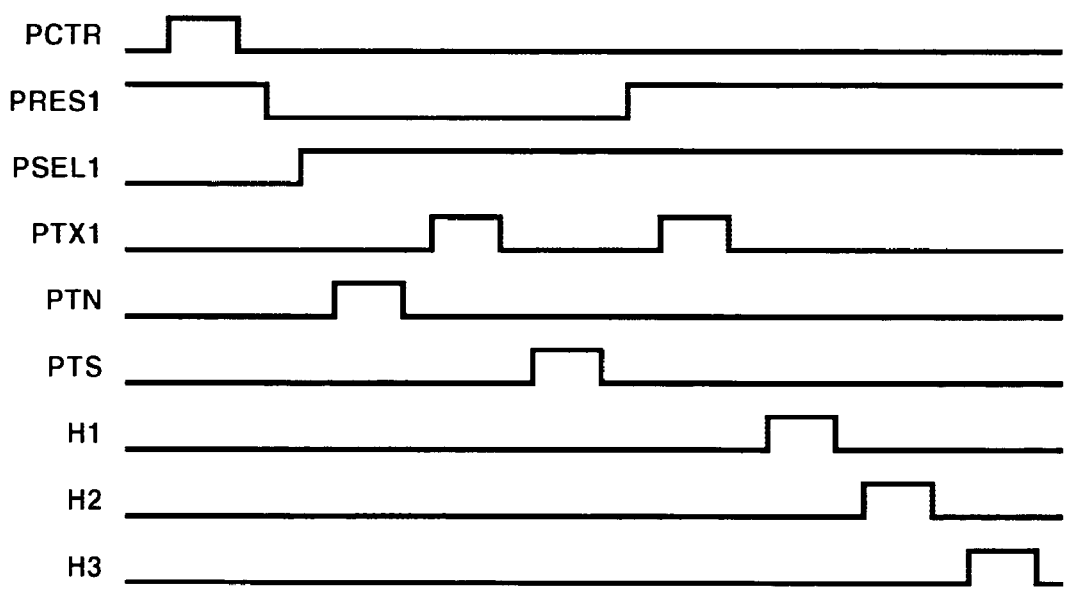
FIG. 4 is a timing diagram showing an operation according to the first exemplary embodiment.

Next, with reference to FIG. 4, an ordinary signal reading operation will be described.

Prior to reading the light signal charge from respective photodiodes D11 through D33, the vertical scanning circuit block 2 supplies a high-level gate potential via the second row selection line PRES1 to the reset MOSs M211 through M231. Thus, the gate potentials of respective amplification MOSs M311 through M331 are reset to the potential of the reset power source. Then, the vertical scanning circuit block 2 supplies a low-level gate potential via the second row selection line PRES1 to the reset MOSs M211 through M231.

Subsequently, the vertical scanning circuit block 2 supplies a high-level gate potential via the third row selection line PSEL1 to the selection MOSs M411 through M431. Then, the terminal PTN supplies a high-level gate potential to the noise signal transfer switches M11 through M13.

With the above operation, the noise signal holding capacitors CTN1 through CTN3 can store reset signals including reset noises (i.e., noise signals). Next, the terminal PTN supplies a low-level gate potential to the noise signal transfer switches M11 through M13.

Next, the vertical scanning circuit block 2 supplies a high-level gate potential via the first row selection line PTX1 to the transfer MOSs M111 through M131. Thus, the light signal charge from the photodiodes D11 through D33 is transferred to gate terminals of the amplification MOSs M311 through M331.

Then, the vertical scanning circuit block 2 supplies a low-level gate potential via the first row selection line PTX1 to the transfer MOSs M111 through M131. Subsequently, the terminal PTS supplies a high-level gate potential to the light signal transfer switches M21 through M23. With the above operation, the light signal holding capacitors CTS1 through CTS3 can store the light signals.

Next, the terminal PTS supplies a low-level gate potential to the light signal transfer switches M21 through M23. With the above operations, the noise signals and the light signals of the pixel cells aligned in the first row can be held in the noise signal holding capacitors CTN1 through CTN3 and the light signal holding capacitors CTS1 through CTS3, respectively.

Next, the vertical scanning circuit block 2 supplies a high-level gate potential via the second row selection line PRES1 to the reset MOSs M211 through M231, and supplies a high-level gate potential via the first row selection line PTX1 to the transfer MOSs M111 through M131. Thus, the light signal charge stored in the photodiodes D11 through D33 is reset.

Subsequently, the horizontal scanning circuit block 7 successively supplies a high-level gate potential to the horizontal transfer switches M41 through M46 of respective columns via the column selection lines H1 through H3. The voltages held in the noise holding capacitors CTN1 through CTN3 and the light signal holding capacitors CTS1 through CTS3 are successively supplied to the differential circuit block 8. The differential circuit block 8 successively outputs, from its output terminal OUT, an output signal representing a difference between the light signal and the noise signal. With the above processing, the reading operation for the pixel cells aligned in the first row can be accomplished.

Subsequently, prior to reading light signal charge of the second row, a terminal PCTR supplies a high-level gate potential to the reset switches M31 through M36 for the noise signal holding capacitors CTN1 through CTN3 and the light signal holding capacitors CTS1 through CTS3. Thus, the noise signal holding capacitors CTN1 through CTN3 and the light signal holding capacitors CTS1 through CTS3 are reset to the GND potential. In a similar manner, the signals from the pixel cells aligned in the second and third rows can be successively read out in response to a control signal supplied from the horizontal scanning circuit block 7. Thus, the reading operation for all pixel cells can be accomplished.

FIG. 11 is a flowchart showing a fundamental image combining procedure performed by the system control section 1014 to obtain a composite image signal which can have a wide dynamic range. When a photodiode (i.e., light-sensitive element) receives incident light exceeding its capacity, photoelectric saturation charge overflows from the photodiode and flows into the floating diffusion region (i.e., reading section) 307.

First, in step S1, the system control section 1014 obtains a saturated light quantity signal. For example, the system control section 1014 can obtain the photoelectric saturation charge having flowed into the floating diffusion region 307, via the amplification MOSFET 310, as a saturated light quantity signal.

The image memory 1009 can store the saturated light quantity signal. The amplification MOSFET 310 converts the electric charge of the floating diffusion region 307 into a voltage. If necessary, the system control section 1014 can apply dark correction to the saturated light quantity signal (in step S3).

Next, in step S2, the system control section 1014 obtains a light-sensitive element signal. For example, the photoelectric charge stored in respective photodiodes D11 through D33 can be read out to the floating diffusion region 307 via the transfer MOSs M111 through M133. The electric charge of the floating diffusion region 307 can be obtained, via the amplification MOSFET 310, as a light-sensitive element signal. If necessary, the system control section 1014 can apply dark correction to the light-sensitive element signal (in step S3).

Next, in step S4, the system control section 1014 performs noise reduction processing applied to the image signal having been subjected to the dark correction. Then, in step S5, the system control section 1014 performs correction processing by multiplying a coefficient (i.e. a correction coefficient) with the saturated light quantity signal.

Then, in step S6, the system control section 1014 adds the light-sensitive element signal to the corrected saturated light quantity signal. Then, in step S7, the system control section 1014 obtains a composite image signal which can have a wide dynamic range.

In the present exemplary embodiment, the system control section 1014 performs three operations: dark correction (refer to step S3); noise reduction (refer to step S4); and coefficient correction (refer to step S5). However, the system control section 1014 can omit one or two of the above-described three operations.

Figure 5:
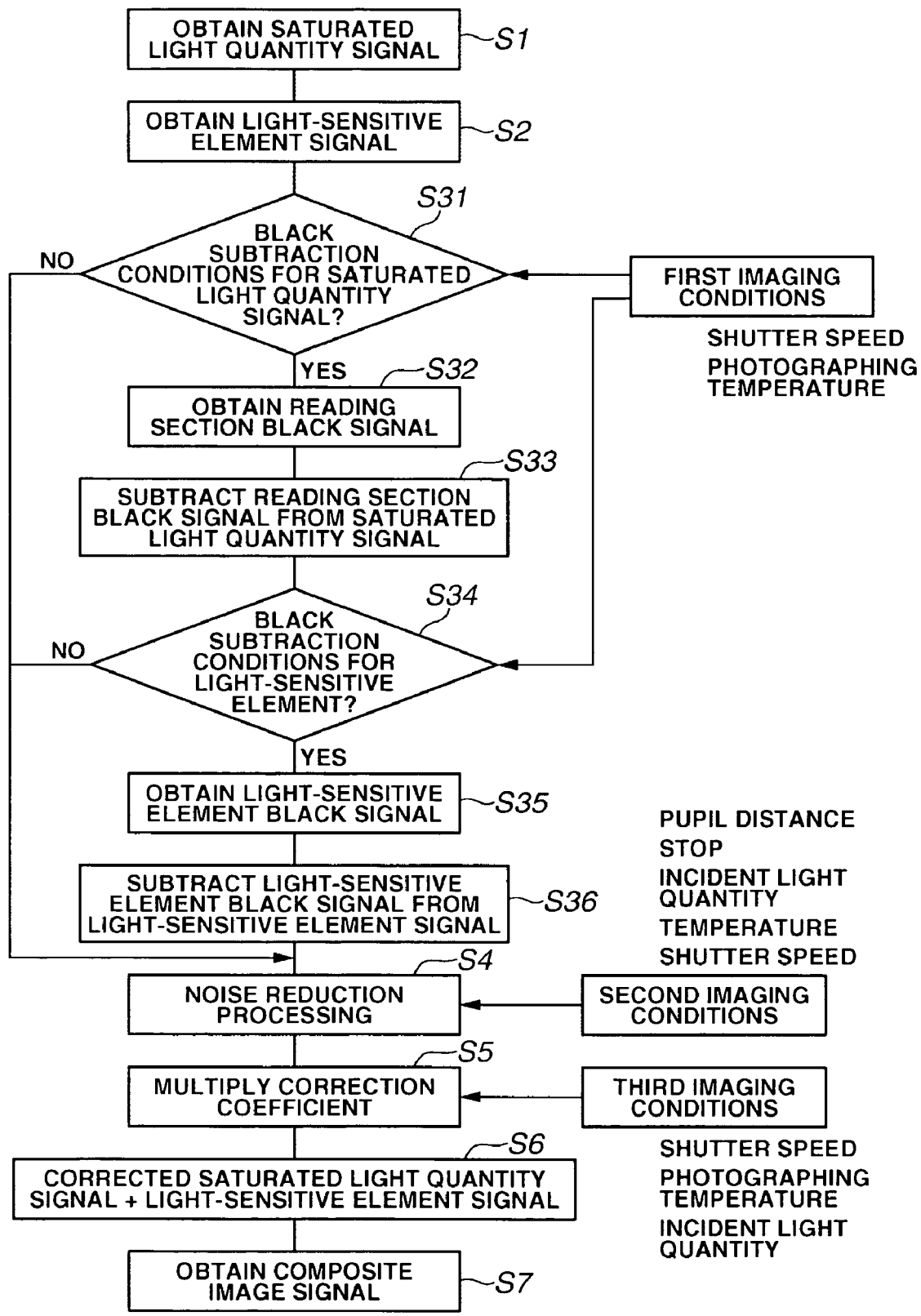
FIG. 5 is a flowchart showing a correction method according to the first exemplary embodiment.

FIG. 5 is a flowchart showing a correction method according to the first exemplary embodiment.

First of all, the system control section 1014 obtains the saturated light quantity signal (refer to step S1) and the light-sensitive element signal (refer to step S2), and performs the dark correction (refer to steps S32, S33, S35, S36).

When the above-described image input apparatus photographs a subject having very high brightness information, the photodiode region (i.e., light-sensitive element) generates photoelectric charge that may exceed its capacity. The excessive charge flows into the floating diffusion region (FD) (i.e., the reading section), even in a condition that the gate terminal of the transfer MOS is held at a low level.

The excessive charge flowing into the reading section is referred to as a saturated light quantity signal, while the light-sensitive element signal represents a signal obtainable from the light-sensitive element. If these signals are combined, a composite image will have a wide dynamic range. However, according to the above-described ordinary reading method, holding a signal for a long time is difficult for the reading section.

In other words, the reading section is not essentially configured to hold the charge for a long time, because the reading section is only required to temporarily hold a signal, after a reset, as a gate voltage for the amplification MOSs M311 through M331.

However, to obtain an enlarged dynamic range, the reading section of the present exemplary embodiment can hold the saturated light quantity signal until a charge accumulation period ends. Therefore, a noise component involved in the signal tends to become larger compared to the ordinary reading operation. If the saturated light quantity signal is directly combined with the light-sensitive element signal, a composite image will have a large noise component depending on photographing conditions. Thus, it can be necessary in some circumstances to perform correction to remove the noises before the saturated light quantity signal and the light-sensitive element signal are combined.

The dark current generated in the reading section is one of noise sources which cannot be generated in the ordinary reading operation. The dark current represents any electric charge generated in the reading section, except the photoelectric charge. The dark current increases depending on temperature or elapsed time. Furthermore, the dark current is a noise component which can have a fixed pattern, which can be removed by subtracting a black image from an original image. In this case, the black image represents an image obtained in a non-exposure state under the same imaging conditions.

For example, as shown in the flowchart of FIG. 5, the system control section 1014 reads the saturated light quantity signal (Step S1) and the light-sensitive element signal (Step S2). The nonvolatile memory 1015 in the image input apparatus can store predetermined imaging conditions. For example, the predetermined imaging conditions can be the temperature exceeding a predetermined level or the charge accumulation period exceeding a predetermined time. When the predetermined imaging conditions are satisfied, the system control section 1014 obtains a reading section black signal representing a non-exposure image from the reading section.

Then, the system control section 1014 reads the saturated light quantity signal from the image memory 1009, and causes the signal processing circuit 1008 to subtract the reading section black signal from the saturated light quantity signal. This correction is generally referred to as "black subtraction", which enables removing the fixed pattern noise chiefly caused by the dark current in the reading section.

Figure 6:
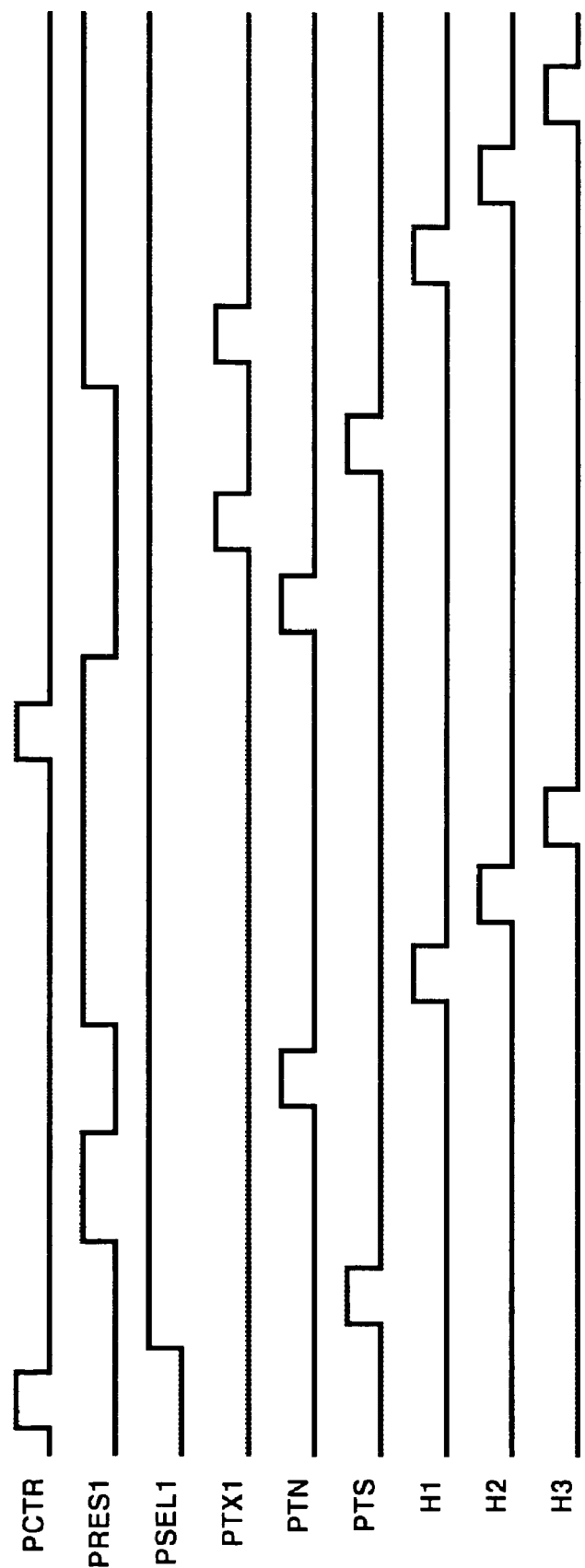
FIG. 6 is a timing diagram showing an operation for reading a saturated light quantity signal according to the first exemplary embodiment.

Next, the operations of the image input apparatus performed in steps S1, S2, and S3 (refer to steps S32, S33, S35, and S36) will be described with reference to the timing diagram shown in FIG. 6.

First, the terminal PTS supplies a high-level gate potential to the light signal transfer switches M21 through M23. At this moment, the saturated light quantity signals stored in the floating diffusion region can be readout to the light signal holding capacitors CTS1 through CTS3.

Next, the terminal PTS supplies a low-level gate potential to the light signal transfer switches M21 through M23. Subsequently, the vertical scanning circuit block 2 supplies a high-level gate potential via the second row selection line PRES1 to the reset MOSs M211 through M231 to reset them to the potential of the reset power source.

Then, the vertical scanning circuit block 2 supplies a low-level gate potential via the second row selection line PRES1 to the reset MOSs M211 through M231. Then, the terminal PTN supplies a high-level gate signal to the noise signal transfer switches M11 through M13. At this moment, the noise signals can be read out to the noise signal holding capacitors CTN1 through CTN3.

Through the above-described operations, the noise signals and the saturated light quantity signals of the pixel cells aligned in the first row can be held in the noise signal holding capacitors CTN1 through CTN3 and the light signal holding capacitors CTS1 through CTS3, which are connected to respective columns.

Then, after a low-level gate potential is supplied from the terminal PTN, the vertical scanning circuit block 2 supplies a high-level gate potential via the second row selection line PRES1 to the reset MOSs M211 through M231, for a reset.

Subsequently, the horizontal scanning circuit block 7 successively supplies a high-level gate potential via the column selection lines H1 through H3 to the horizontal transfer switches M41 through M46 of respective columns. The voltages held in the noise holding capacitors CTN1 through CTN3 and the light signal holding capacitors CTS1 through CTS3 can be successively read out to the differential circuit block 8. The differential circuit block 8 successively outputs, via its output terminal OUT, an output signal representing a difference between the saturated light quantity signal and the noise signal.

The output signal is A/D converted and stored in the image memory 1009. Then, the terminal PCTR supplies a high-level gate potential to the reset switches M31 through M36 for the noise signal holding capacitors CTN1 through CTN3 and the light signal holding capacitors CTS1 through CTS3. Thus, the noise signal holding capacitors CTN1 through CTN3 and the light signal holding capacitors CTS1 through CTS3 are reset to the GND potential (refer to step S1).

Then, the system control section 1014 reads the light-sensitive element signal remaining in the photodiode region and can store an A/D converted signal in the image memory 1009 (refer to step S2). This operation is related to the above-described ordinary reading operation.

Then, the system control section 1014 checks if the saturated light quantity signal includes a noise component in the present imaging condition. For example, when the shutter speed or the photographing temperature exceeds a predetermined level, the saturated light quantity signal includes a significant amount of noise. Therefore, the system control section 1014 determines whether the saturated light quantity signal requires the black subtraction (refer to step S31).

When the saturated light quantity signal requires the black subtraction (i.e., YES in step S31), the system control section 1014 reads a reading section black signal (refer to step S32). To this end, after obtaining the saturated light quantity signal and the light-sensitive element signal, the system control section 1014 performs processing for reading a black signal from the reading section in a light-shielded state where the mechanical shutter 1002 is completely closed, under the same imaging condition. Subsequently, the system control section 1014 subtracts the reading section black signal from the saturated light quantity signal (refer to step S33).

Similarly, if the shutter speed is slow and the temperature is high, the system control section 1014 can perform similar black subtraction for the light-sensitive element signal. Therefore, the system control section 1014 determines whether the light-sensitive element signal requires black subtraction (refer to step S34). Namely, the system control section 1014 checks if the light-sensitive element signal includes a noise component in the present imaging condition. For example, when the shutter speed or the photographing temperature exceeds a predetermined level, the light-sensitive element signal includes a significant amount of noise.

When the light-sensitive element signal requires the black subtraction (i.e., YES in step S34), the system control section 1014 reads a light-sensitive element black signal (refer to step S35). To this end, after reading the saturated light quantity signal in a light-shielded state, the system control section 1014 performs processing for reading a black signal from the light-sensitive element in a light-shielded state where the mechanical shutter 1002 is completely closed, under the same imaging condition. The system control section 1014 can store an A/D converted black signal in the image memory 1009. Subsequently, the system control section 1014 subtracts the light-sensitive element black signal from the light-sensitive element signal (refer to step S36).

In the flowchart shown in FIG. 5, the processing of step S31 can be omitted if the processing flow proceeding directly from step S2 to step S32 is desired. Similarly, the processing of step S34 can be omitted if the processing flow proceeding directly from step S33 to step S35 is desired.

Furthermore, when no black subtraction is required in steps S31 and S34, the system control section 1014 skips the sequential processing in steps S32, S33, S35, and S36, and proceeds to the succeeding processing.

Next, the system control section 1014 can perform the noise reduction (refer to step S4) in the following manner.

Besides the dark current, stray light noises or various random noises are other noise sources which cannot be generated in the ordinary reading operation. The light-shielding plate provided above the reading section can prevent light from directly reaching the reading section. However, after entering through an opening above the light-sensitive element, the light can cause repetitive reflections in the element. Accordingly, part of the light can leak out to the reading section. The leaked light is generally referred to as "stray light."

When the stray light enters the reading section, the reading section produces photoelectric charge proportional to the energy of the stray light. Thus, a signal produced from the reading section possibly includes a noise component corresponding to the photoelectric charge caused by the stray light.

According to an ordinary reading operation, it is unnecessary to read a signal having flowed into the reading section. Thus, the reading section can be reset immediately before reading a noise signal. However, as described above, the present exemplary embodiment requires reading the saturated light quantity signal from the reading section. Therefore, the reading section cannot be reset and an image signal obtained from the reading section includes some noise.

Obtaining an excellent image can require removing such noise that cannot be removed by the black subtraction. The noise component deriving from the stray light greatly changes depending on the quantity of light or an incident angle of the light. When the stop is widely opened and the exit pupil distance is large, a ratio of the stray light component to the incident light quantity becomes larger.

Namely, a noise reduction amount can be changed considering stop, exit pupil distance, and incident light quantity. For example, the nonvolatile memory 1015 can store tables showing the relationship between an output value of the solid-state image sensor and a noise reduction amount, which varies depending on the incident light quantity, for each of possible combinations of the exit pupil distance and the stop.

The system control section 1014 can detect the stop and the exit pupil distance during a photographing operation, and can refer to a corresponding table stored in the nonvolatile memory 1015. Then, the system control section 1014 can determine a required noise reduction amount based on an output value of the solid-state image sensor in each pixel, and can cause the signal processing circuit 1008 to subtract the noise reduction amount from the saturated light quantity signal. With the above-described method, the stray light component can be completely removed.

However, the random noises other than the stray light cannot be completely removed, although the saturated light quantity signal and the light-sensitive element signal can be naturally and smoothly combined by appropriately offsetting the saturated light quantity signal. The dark current shot noise is representative of such random noises. The dark current shot noise can be defined as a random noise corresponding to a variation in the generated dark current.

Especially, in a case where the incident light quantity cannot saturate the light-sensitive element, a saturated light quantity signal can include a dark current shot noise that cannot be completely removed by the black subtraction. Thus, removing the dark current shot noise can be useful to obtain a natural image.

To this end, related to the correction applied to stray light noises, the nonvolatile memory 1015 can store offset amounts (i.e., noise reduction amounts) for various temperatures and shutter speeds (i.e., parameters of dark current shot noises). The system control section 1014 can cause the signal processing circuit 1008 to subtract a value corresponding to the imaging condition (e.g., temperature, shutter speed).

With the above processing, a composite image signal including a no or little noise component can be obtained, even when a saturated light quantity signal is combined with a light-sensitive element signal obtainable from a pixel in a condition that the light-sensitive element is not fully saturated by the incident light.

As described above, in step S4, the system control section 1014 subtracts a noise reduction amount corresponding to an imaging condition from the saturated light quantity signal. The imaging condition includes at least one of shutter speed, photographing temperature, incident light quantity, lens pupil distance, and stop.

Next, the system control section 1014 performs correction processing with a coefficient (refer to step S5). As described above, when the light-sensitive element receives a great amount of light, excessive photoelectric charge overflows from the light-sensitive element and flows into the reading section or into a peripheral region.

Figure 7A:
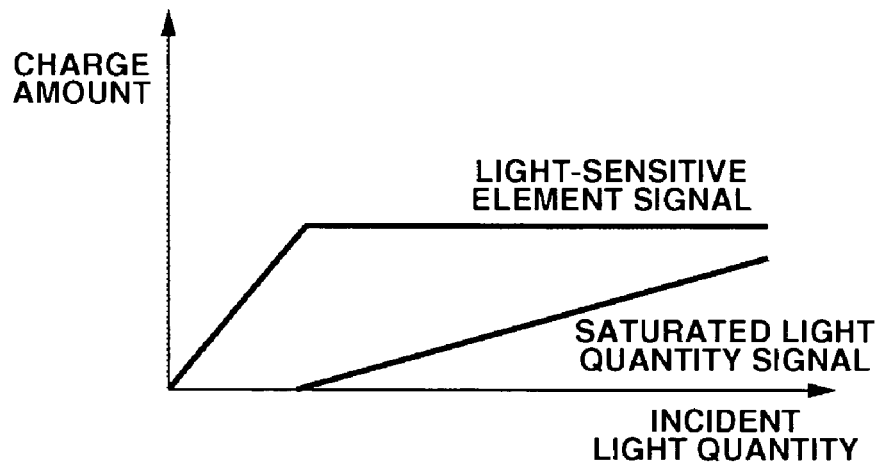
FIGS. 7A through 7C are graphs showing correction of a gradient of the saturated light quantity signal according to the first exemplary embodiment.
Figure 7B:
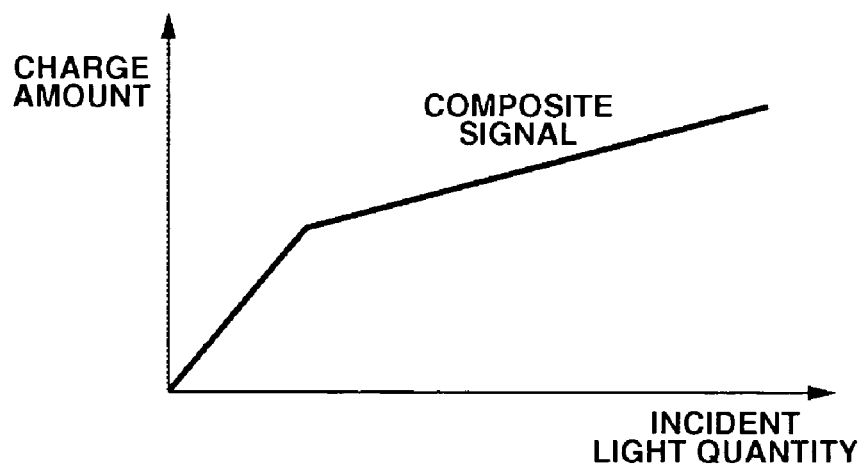
Figure 7C:
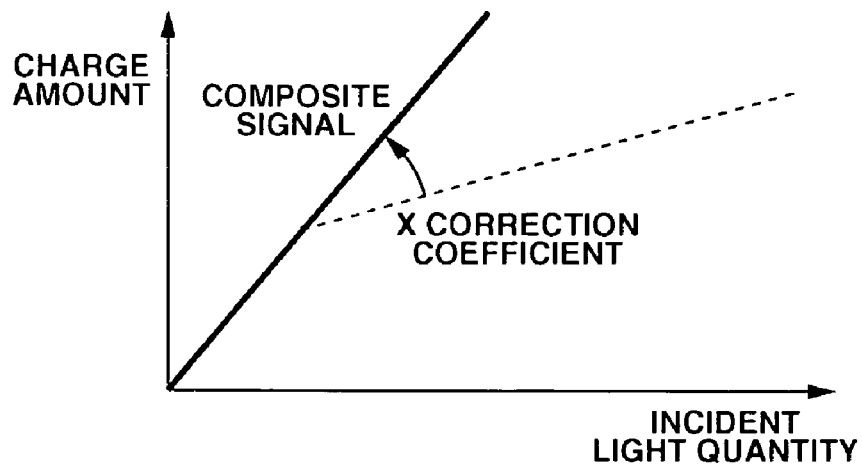

For example, a rate of storable charge per unit time in the light-sensitive element can be different from a rate of storable charge per unit time in the reading section, as understood from FIGS. 7A through 7C. In each graph shown in FIGS. 7A through 7C, the abscissa represents an incident light quantity and the ordinate represents a generated photoelectric charge amount.

FIG. 7A is a graph showing a relationship between the saturated light quantity signal and the light-sensitive element signal, in a condition that both signals are not yet subjected to the correction processing. According to the above-described principle, the light-sensitive element signal increases linearly in proportion to the incident light quantity until the photodiode is saturated.

Subsequently, after the photodiode is saturated, excessive photoelectric charge starts flowing into the reading section and accordingly the saturated light quantity signal starts increasing linearly in proportion to the incident light quantity. However, as described above, an increase rate of the light-sensitive element signal is different from an increase rate of the saturated light quantity signal.

If the light-sensitive element signal and the saturated light quantity signal are combined directly, a composite image will be unnatural because of a tone jump produced at a switching point of two signals as shown in FIG. 7B.

Therefore, prior to combining the saturated light quantity signal with the light-sensitive element signal, the system control section 1014 multiplies a correction coefficient with the obtained saturated light quantity signal with reference to a predetermined imaging condition (e.g., charge accumulation time, charge accumulation temperature, and charge accumulation amount). FIG. 7C shows a corrected natural composite image signal having no tone jump.

However, if the solid-state image sensor has a different arrangement, a rate of photoelectric charge overflowing from the light-sensitive element and flowing into the reading section will change differently depending on the charge accumulation time, the charge accumulation temperature, and the charge accumulation amount. In such a case, the correction coefficient can be changed depending on the above-described conditions.

Related to the coefficient for the above-described noise reduction, the nonvolatile memory 1015 can store an appropriate amount of correction coefficients corresponding to various conditions. The system control section 1014 can detect a current photographing condition, and can select a predetermined correction coefficient based on the detected photographing condition. The signal processing circuit 1008 can multiply the selected correction coefficient with the saturated light quantity signal.

The correction coefficient can be determined according to the imaging condition (e.g., shutter speed, photographing temperature, or incident light quantity). Furthermore, the correction coefficient can be proportional to the rate of photoelectric saturation charge overflowing from the photodiode (i.e., light-sensitive element) and flowing into the floating diffusion region (i.e., reading section) 307. In other words, the correction coefficient can be determined without relying on the imaging condition.

However, in the practical process of overflowing from the photodiode and flowing into the reading section, the photoelectric charge does not always start overflowing immediately after the photodiode is fully saturated. There is a transient state where part of the photoelectric charge starts flowing into the reading section before the photodiode is fully charged. In this case, combining a transient portion of the photodiode and a transient portion of the reading section can realize an approximate combination.

Applying corrections to the signals as described above with reference to the flowchart of FIG. 5 enables properly obtaining a noiseless composite image which can have a natural wide dynamic range. The processing order of the above-described plural corrections can be changed if desired. However, to prevent a noise component from being unnecessarily enlarged by multiplying a correction coefficient, the coefficient correction processing should be performed after accomplishing the black subtraction and the noise reduction.

Second Exemplary Embodiment

A second exemplary embodiment of the present invention is directed to a correction method applied to an imaging apparatus including a junction-type field-effect transistor (JFET) in its output section. The imaging apparatus of the second exemplary embodiment is related to that of the first exemplary embodiment.

Figure 8:
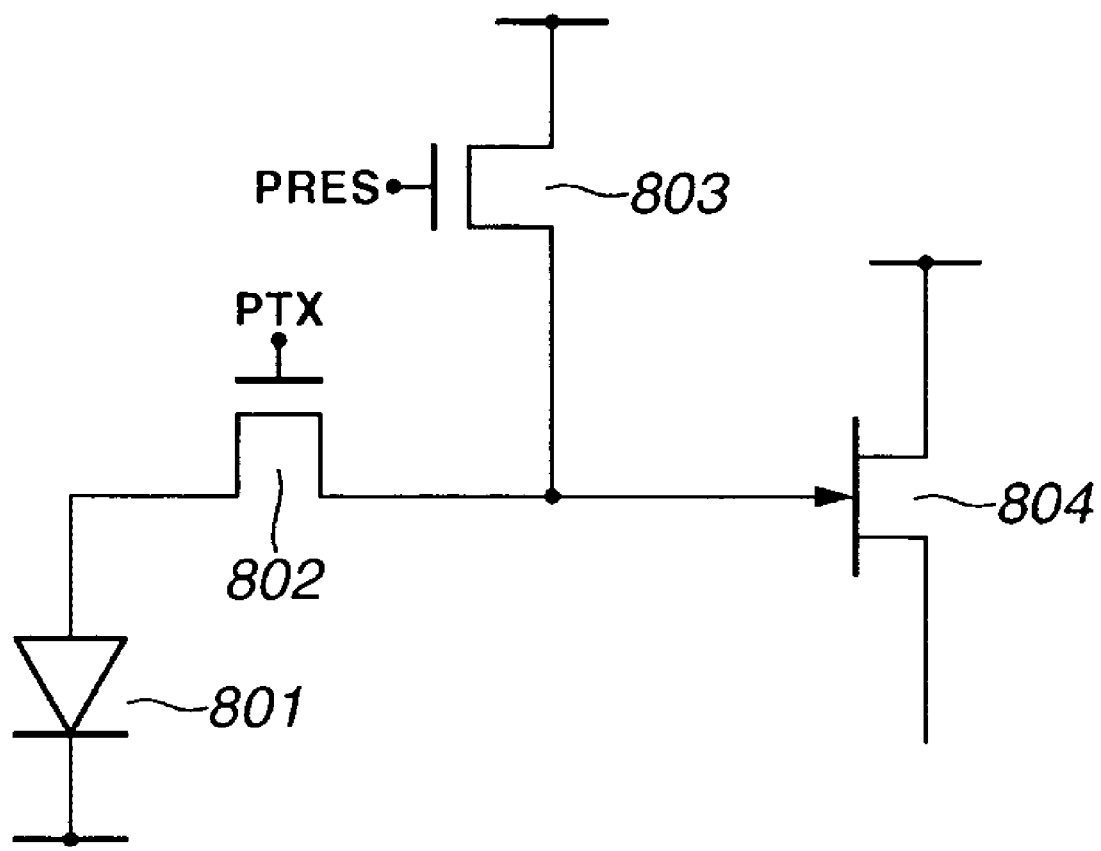
FIG. 8 is a block diagram illustrating a solid-state image sensor according to a second exemplary embodiment.

FIG. 8 is a block diagram illustrating a JFET solid-state image sensor according to the second exemplary embodiment, which is related to the solid-state image sensor of the first exemplary embodiment in the arrangement of the output section succeeding the amplification transistor.

A photodiode 801 has a cathode biased to a constant potential and an anode connected to a source terminal of a p-channel type transfer MOSFET 802. The transfer MOSFET 802 has a gate terminal connected to a row selection line PTX. The transfer MOSFET 802 has a drain terminal connected to a gate terminal of an amplification JFET 804.

The gate terminal of the amplification JFET 804 is connected to a source terminal of a p-channel type reset MOSFET 803, which resets the amplification JFET 804. The reset MOSFET 803 has a drain terminal connected to a reset power source. Furthermore, the amplification JFET 804 has a drain terminal connected to a power source, which can supply a power source voltage. The signal path extending from the source of the amplification JFET 804 is related to that described in the first exemplary embodiment.

Figure 9:
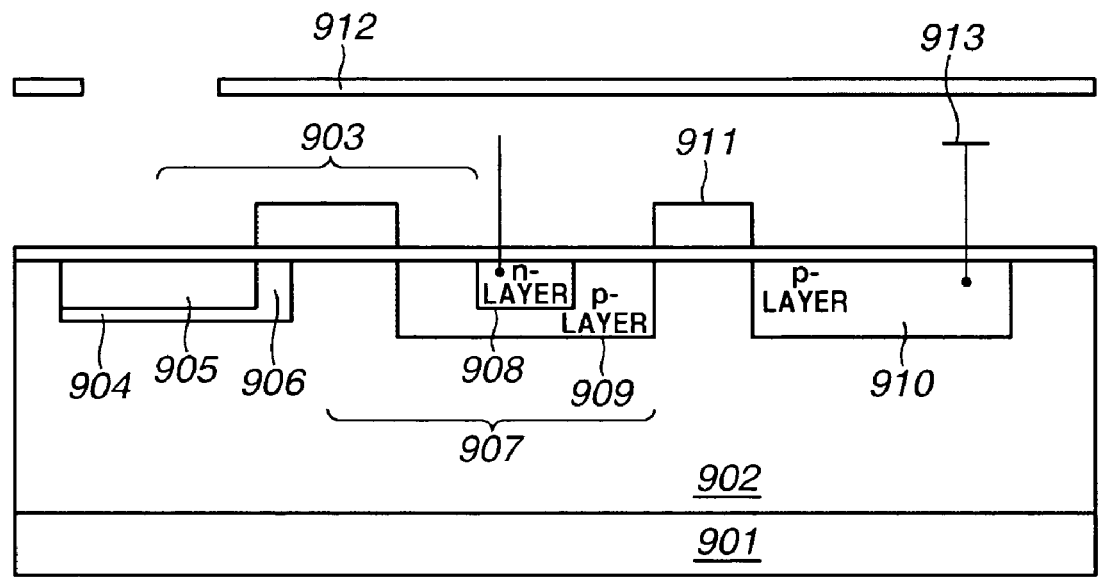
FIG. 9 is a cross-sectional view illustrating one pixel of the solid-state image sensor according to the second exemplary embodiment.

FIG. 9 is a cross-sectional view illustrating one pixel of the image sensor using a JFET as an amplification transistor.

As illustrated in FIG. 9, the second exemplary embodiment differs from the first exemplary embodiment in that each pixel section includes a P-type substrate 901, an n-type well 902 formed on the P-type substrate 901, a P-type photodiode 904 formed on the n-type well 902, and a high-density n-layer 905 formed on the P-type photodiode 904.

A gate region of a p-channel type transfer MOSFET 903 is formed via an insulating layer on a side surface of the photodiode 904. A bypass region 906, continuously extending from the p-layer of the photodiode 904, is formed between the gate region of the transfer MOSFET 903 and the side surface of the photodiode 904. An n-channel JFET 907, provided in an amplifier region, includes an n-type source region 908 and a p-type gate region 909.

A p-channel type reset MOSFET 911 includes a gate region formed via an insulating film on a border region between the p-type gate region 909 of the amplification JFET 907 and a p-type reset drain region 910. An aluminum light-shielding plate 912 is provided above the element, so that no light can reach a region other than the photodiode 904.

Compared to the first exemplary embodiment, which can use a MOSFET as an amplifier, the second exemplary embodiment is characterized in that the carriers in a region extending from the photodiode 904 to the JFET 907 are holes (not electrons).

The second exemplary embodiment does not require the floating diffusion region (FD) 307 provided in the first exemplary embodiment, because the gate region 909 can function as a reading section. Furthermore, the second exemplary embodiment does not require the selection MOSs M411 through M433 shown in FIG. 2, because the reset MOSFET 911 has a similar function.

Figure 10:
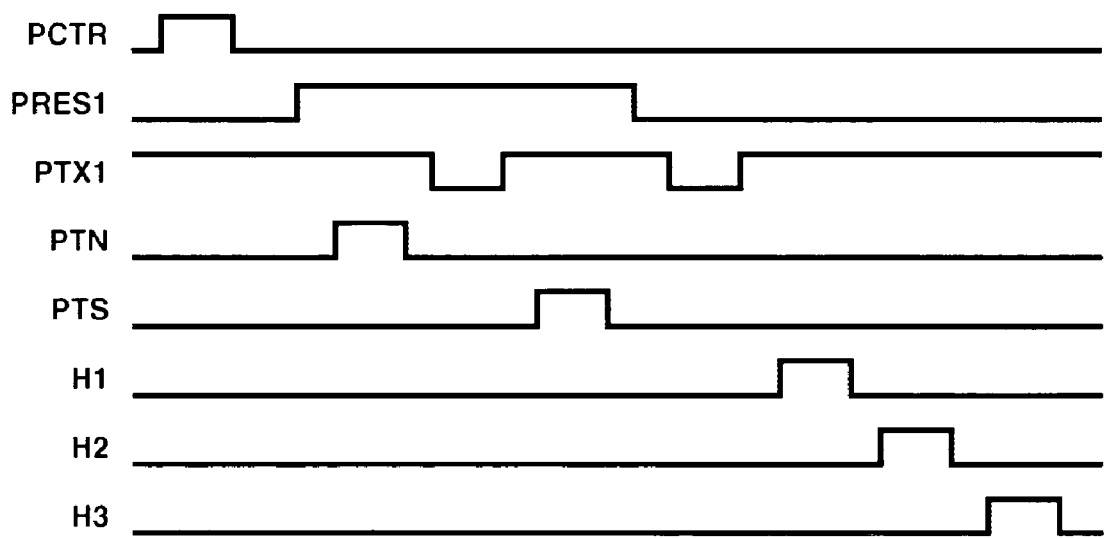
FIG. 10 is a timing diagram showing a reading operation according to the second exemplary embodiment.

FIG. 10 is a timing diagram showing a reading operation according to the second exemplary embodiment. In the second exemplary embodiment, both the transfer MOSFET 903 and the reset MOSFET 911 are of p-channel type. Accordingly, the MOSFET in the second exemplary embodiment is opposite in polarity to the MOSFET in the first exemplary embodiment.

For example, the MOSFET turns into an OFF state in response to a high-level gate potential and turns into an ON state in response to a low-level gate potential. Furthermore, as described above, the reset MOS can function as the selection MOS. The row selection operation is unnecessary. The correction method of the second exemplary embodiment is related to that of the first exemplary embodiment.

As described above, according to the first and second exemplary embodiments, a solid-state image sensor includes a light-sensitive element and a reading section. When a large quantity of light enters the light-sensitive element, photoelectric charge generated in the light-sensitive element flows into the reading section. A signal stored in the light-sensitive element and a signal stored in the reading section can be independently read out to form a composite image signal.

A system control section reads both the saturated light quantity signal and the light-sensitive element signal from the solid-state image sensor, and determines, based on an imaging condition, whether the readout signal requires the black subtraction.

If the black subtraction is necessary, the system control section obtains a dark image in a non-exposure state, under the same imaging condition, and performs the black subtraction. Furthermore, according to the imaging condition, the system control section subtracts a noise component generated in the reading section during a charge accumulation period of the light-sensitive element.

Furthermore, according to the imaging condition, the system control section multiplies a correction coefficient with the saturated light quantity signal. The correction coefficient can be dependent on a photoelectric charge amount overflowing from the light-sensitive element and flowing into the reading section.

Then, the system control section obtains a composite image signal based on the corrected saturated light quantity signal and the light-sensitive element signal. By performing the above corrections, the system control section can obtain a noiseless image, which can have a wide dynamic range and a natural gradation.

Furthermore, prior to reading the light quantity signal from the light-sensitive element, the system control section reads the saturated light quantity signal (i.e., photoelectric saturation charge stored in the reading section) and the light-sensitive element signal (i.e., photoelectric charge stored in the light-sensitive element).

Thus, a noiseless image having an excellent gradation can be obtained by performing corrections when two signals are combined to obtain a composite image signal which can have a wide dynamic range.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2005-192584 filed Jun. 30, 2005, which is hereby incorporated by reference herein in its entirety.

What is claimed is:

1. An image input apparatus comprising:
   a pixel section including a light-sensitive element configured to generate electric charge by photoelectric conversion; a semiconductor region configured to receive a light signal charge transferred from the light-sensitive element; and a transfer switch configured to transfer the light signal charge from the light-sensitive element to the semiconductor region;
   an image processing section configured to form an image based on a composite signal obtained by combining a saturation signal representing the light signal charge overflowing from the light-sensitive element and flowing into the semiconductor region and a photoelectric conversion signal representing the light signal charge stored in the light-sensitive element; and
   a control section configured to, in a case where satisfying predetermined imaging condition, obtain a first black signal based on an electric charge which occurs in the semiconductor region in a light-shielded state, subtract the first black signal from the saturation signal, obtain a second black signal based on an electric charge which occurs in the light-sensitive element in a light-shielded state, subtract the second black signal from the photoelectric conversion signal, and combine the saturation signal from which the first black signal is subtracted and the photoelectric conversion signal from which the second black signal is subtracted.

2. The image input apparatus according to claim 1, wherein the predetermined imaging condition is that shutter speed or photographing temperature is more than predetermined value.

3. The image input apparatus according to claim 1, wherein the control section multiplies the saturation signal by a correction coefficient before combining the saturation signal with the photoelectric conversion signal.

4. The image input apparatus according to claim 3, wherein the correction coefficient is determined with reference to a predetermined imaging condition.

5. The image input apparatus according to claim 3, wherein the correction coefficient is determined with reference to at least one of charge accumulation time, charge accumulation temperature, and charge accumulation amount.

6. The image input apparatus according to claim 3, wherein the correction coefficient is selected, from a plurality of stored predetermined correction coefficients, based on a detected photographing condition.

7. The image input apparatus according to claim 3, wherein the correction coefficient is determined according to at least one of shutter speed, photographing temperature, and incident light quantity.

8. The image input apparatus according to claim 3, wherein the correction coefficient is proportional to the rate of photoelectric charge overflowing from the light-sensitive element.

9. A control method for an image input apparatus including a pixel section, including a light-sensitive element configured to generate electric charge by photoelectric conversion, a semiconductor region configured to receive a light signal charge transferred from the light-sensitive element, and a transfer switch configured to transfer the light signal charge from the light-sensitive element to the semiconductor region, the control method comprising:
   forming an image based on a composite signal obtained by combining a saturation signal representing the light signal charge overflowing from the light-sensitive element and flowing into the semiconductor region and a photoelectric conversion signal representing the light signal charge stored in the light-sensitive element; and
   in a case where satisfying predetermined imaging condition, obtaining a first black signal based on an electric charge which occurs in the semiconductor region in a light-shielded state, subtracting the first black signal from the saturation signal, obtaining a second black signal based on an electric charge which occurs in the light-sensitive element in a light-shielded state, subtracting the second black signal from the photoelectric conversion signal, and combining the saturation signal from which the first black signal is subtracted and the photoelectric conversion signal from which the second black signal is subtracted.

10. The control method according to claim 9, wherein the predetermined imaging condition is that shutter speed or photographing temperature is more than predetermined value.

11. The control method according to claim 9, multiplying the saturation signal by a correction coefficient before combining the saturation signal with the photoelectric conversion signal.

12. The control method according to claim 11, wherein the correction coefficient is determined with reference to a predetermined imaging condition.

13. The control method according to claim 11, wherein the correction coefficient is determined with reference to at least one of charge accumulation time, charge accumulation temperature, and charge accumulation amount.

14. The control method according to claim 11, wherein the correction coefficient is selected, from a plurality of stored predetermined correction coefficients, based on a detected photographing condition.

15. The control method according to claim 11, wherein the correction coefficient is determined according to at least one of shutter speed, photographing temperature, and incident light quantity.

16. The control method according to claim 11, wherein the correction coefficient is proportional to the rate of photoelectric charge overflowing from the light-sensitive element.

* * * * *